US011480619B2

(12) United States Patent
Inoue

(10) Patent No.: US 11,480,619 B2
(45) Date of Patent: Oct. 25, 2022

(54) ESTIMATION APPARATUS, ESTIMATION METHOD, AND COMPUTER PROGRAM

(71) Applicant: GS Yuasa International Ltd., Kyoto (JP)

(72) Inventor: Naoki Inoue, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 267 days.

(21) Appl. No.: 16/758,433

(22) PCT Filed: Oct. 22, 2018

(86) PCT No.: PCT/JP2018/039201
§ 371 (c)(1),
(2) Date: Apr. 23, 2020

(87) PCT Pub. No.: WO2019/082846
PCT Pub. Date: May 2, 2019

(65) Prior Publication Data
US 2020/0249278 A1 Aug. 6, 2020

(30) Foreign Application Priority Data
Oct. 24, 2017 (JP) .............................. JP2017-205559

(51) Int. Cl.
*G01R 31/3835* (2019.01)
*H01M 4/48* (2010.01)
(Continued)

(52) U.S. Cl.
CPC ........ *G01R 31/3835* (2019.01); *H01M 4/483* (2013.01); *H01M 10/0525* (2013.01);
(Continued)

(58) Field of Classification Search
CPC .................. G01R 31/3835; G01R 31/388; G01R 31/392; H01M 4/483; H01M 10/0525;
(Continued)

(56) References Cited

U.S. PATENT DOCUMENTS

2005/0118496 A1 6/2005 Chang et al.
2010/0173184 A1* 7/2010 Shiozaki ............... H01M 4/364
429/207

(Continued)

FOREIGN PATENT DOCUMENTS

JP 2006-514776 A 5/2006
JP 2012-54220 A 3/2012
(Continued)

OTHER PUBLICATIONS

International Search Report (ISR) dated Dec. 25, 2018 filed in PCT/JP2018/039201.

*Primary Examiner* — Akm Zakaria
(74) *Attorney, Agent, or Firm* — Rankin, Hill & Clark LLP

(57) ABSTRACT

An estimation apparatus estimates an internal state of an energy storage device having a positive electrode, a negative electrode including a negative active material that contains $SiO_x$, and a nonaqueous electrolyte, the energy storage device changing from a positive-electrode limiting type, in which a discharge capacity is limited by the positive electrode, to a negative-electrode limiting type, in which the discharge capacity is limited by the negative electrode. The estimation apparatus estimates the internal state of the energy storage device by using a voltage value and an energization amount in a predetermined voltage range of the energy storage device or at a predetermined measured voltage value, or based on information on the shape of a discharge curve of the energy storage device.

13 Claims, 10 Drawing Sheets

(51) Int. Cl.
*H01M 10/0525* (2010.01)
*H01M 10/48* (2006.01)
*H02J 7/00* (2006.01)
*H01M 4/02* (2006.01)

(52) U.S. Cl.
CPC ........... *H01M 10/48* (2013.01); *H02J 7/0047* (2013.01); *H01M 2004/027* (2013.01)

(58) Field of Classification Search
CPC .. H01M 10/48; H01M 2004/027; H01M 4/48; H01M 10/052; H02J 7/0047; H02J 7/00; Y02E 60/10
See application file for complete search history.

(56) References Cited

U.S. PATENT DOCUMENTS

| | | | | |
|---|---|---|---|---|
| 2010/0264929 A1* | 10/2010 | Ugaji | ............... | H01M 10/0525 324/426 |
| 2011/0012604 A1* | 1/2011 | Tsujiko | ............. | H01M 10/0525 324/427 |
| 2013/0108930 A1 | 5/2013 | Patterson et al. | | |
| 2013/0119940 A1* | 5/2013 | Iriyama | .............. | G01R 31/3835 320/134 |
| 2015/0301123 A1 | 10/2015 | Tao et al. | | |
| 2016/0181833 A1* | 6/2016 | Araki | ................. | G01R 31/3828 320/134 |
| 2016/0254687 A1* | 9/2016 | Tanaka | .................... | H02J 7/045 320/112 |
| 2017/0102436 A1 | 4/2017 | Tao et al. | | |

FOREIGN PATENT DOCUMENTS

| | | |
|---|---|---|
| JP | 2013-068458 A | 4/2013 |
| JP | 2017-20916 A | 1/2017 |
| JP | 2017-020916 A | 1/2017 |
| JP | 2017-97995 A | 6/2017 |
| WO | 2014/083813 A1 | 6/2014 |

* cited by examiner

ESTIMATION APPARATUS, ESTIMATION METHOD, AND COMPUTER PROGRAM

TECHNICAL FIELD

One aspect of the present invention relates to an estimation apparatus, an estimation method, and a computer program for estimating an internal state of an energy storage device.

BACKGROUND ART

Energy storage devices such as lithium ion secondary batteries have been used as power supplies for mobile equipment such as notebook computers and mobile phones. In recent years, the energy storage devices have been used in a wide range of fields, such as power supplies for electric vehicles (EVs), hybrid electric vehicles (HEVs), and plug-in hybrid electric vehicles (PHEVs), and a secondary battery of a high capacity type has been expected to be achieved depending on the application.

As such a next-generation high-capacity battery, a battery using $SiO_x$ (0.5≤x≤1.5), which is silicon oxide, as an active material of a negative electrode has attracted attention in recent years.

For mounting a secondary battery in an EV or the like, it is important to estimate the state of deterioration in energy storage device, such as the amount of capacity decrease, and various techniques have been proposed (e.g., see Patent Document 1).

Unlike a typical carbon-based negative electrode, which has been well studied in the past, a conventional method for estimating a deterioration state cannot be applied to the lithium ion secondary battery using $SiO_x$ for the negative electrode due to a difference in characteristics. The present applicant has found that in an energy storage device using $SiO_x$ for the negative electrode, there is a correlation between a capacity retention ratio and dQ/dV that is the amount of change in energization amount with respect to the amount of change in voltage value at the end of discharge, and made it possible to estimate the deterioration state (cf. Patent Document 2).

PRIOR ART DOCUMENTS

Patent Documents

Patent Document 1: JP-A-2013-68458
Patent Document 2: JP-A-2017-20916

SUMMARY OF THE INVENTION

Problems to be Solved by the Invention

In the case of a negative-electrode limiting type energy storage device using $SiO_x$ for the negative electrode, the amount of solid electrolyte solution interface (SEI) coating formed on the interface between the active material of the negative electrode and the electrolyte solution increases due to repeated charge and discharge, and the amount of trapped Li in the SEI coating increases. (A limiting electrode refers to an electrode having a smaller discharge capacity in terms of battery design. An energy storage device with a negative electrode having a smaller discharge capacity than that of a positive electrode is called a negative-electrode limiting type because the discharge capacity of the energy storage device is limited by the discharge capacity of the negative electrode. As a result, the shift amount of the capacity balance between the positive and negative electrodes increases.

It has been studied that before a battery reaction is started, a pre-doping treatment with Li, which makes the negative electrode contain stoichiometrically more Li ions than the positive electrode, is performed in advance to construct a positive-electrode limiting type energy storage device in which the discharge capacity is limited by the discharge capacity of the positive electrode. The discharge capacity ratio of the negative electrode to the positive electrode increases, thus leading to a decrease in utilization factor of the negative electrode and reducing an increase in the shift amount of the capacity balance between the positive and negative electrodes due to repetition of charge and discharge. As a result, capacity deterioration is reduced, and cycle performance is improved.

In such an energy storage device, it has been required to estimate an internal state.

An object of one aspect of the present invention is to provide an estimation apparatus, an estimation method, and a computer program that can estimate an internal state of an energy storage device that changes from a positive-electrode limiting type to a negative-electrode limiting type.

Means for Solving the Problems

An estimation apparatus according to one aspect of the present invention is an estimation apparatus that estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode, the estimation apparatus including: an acquisition unit that acquires a voltage value and an energization amount in a predetermined voltage range of the energy storage device or at a predetermined measured voltage value; and an estimation unit that estimates the internal state of the energy storage device by using the voltage value and the energization amount.

An estimation apparatus according to another aspect of the present invention is an estimation apparatus that estimates an internal state of an energy storage device having a positive electrode, a negative electrode including a negative active material that contains silicon oxide (SiO), and a nonaqueous electrolyte, the energy storage device changing from a positive-electrode limiting type, in which a discharge capacity is limited by the positive electrode, to a negative-electrode limiting type, in which the discharge capacity is limited by the negative electrode, the estimation apparatus including: an estimation unit that estimates the internal state of the energy storage device based on information on a shape of a discharge curve of the energy storage device in a voltage range in which a potential of the negative electrode is equal to or greater than a first preset value, or information on a shape of a discharge curve of the energy storage device in a voltage range in which a potential of the negative electrode is smaller than a second preset value.

Advantages of the Invention

In the energy storage device that changes from the positive-electrode limiting type to the negative-electrode limiting type with the use (cycle), it is possible to estimate the deterioration state of the energy storage device by using a voltage value and an energization amount in a predetermined voltage range of the energy storage device or a predetermined measured voltage value, or based on information on the shape of a discharge curve.

MODES FOR CARRYING OUT THE INVENTION

Hereinafter, the present invention will be specifically described with reference to the drawings showing the embodiments.

Summary of Embodiment

A negative electrode of an energy storage device (non-aqueous electrolyte secondary battery) according to the embodiment includes an active material containing $SiO_x$, and the energy storage device is a positive-electrode limiting type after manufacturing.

Figure 1:
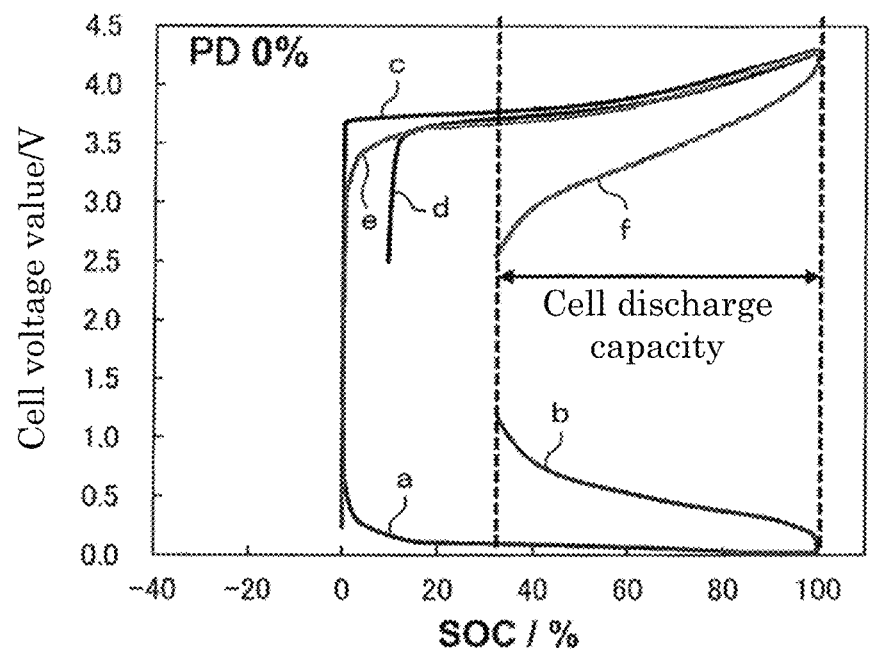
FIG. 1 is a graph showing a charge-discharge curve in a case where a pre-doping amount (PD) of Li with respect to a negative electrode is 0%.
Figure 2:
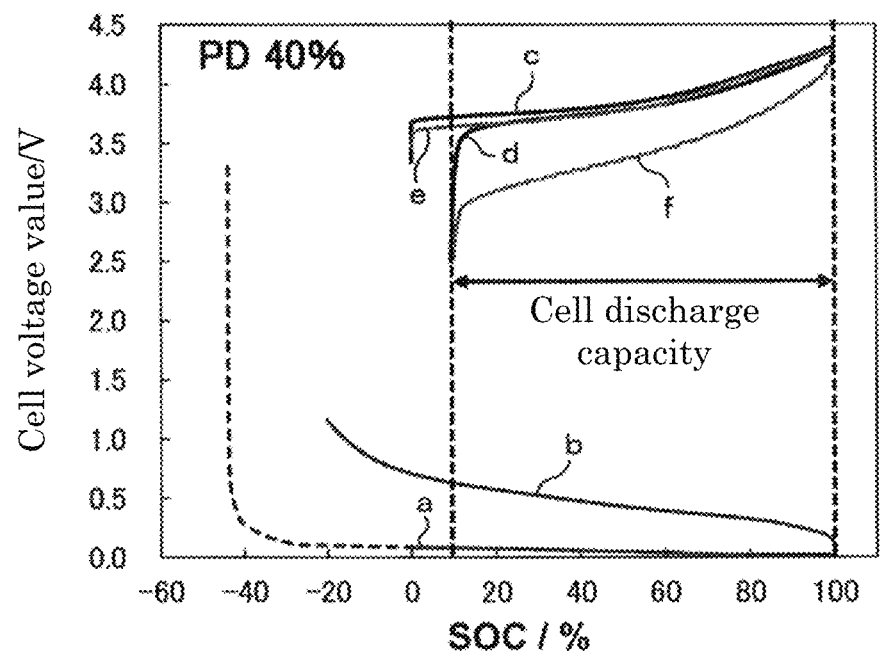
FIG. 2 is a graph showing a charge-discharge curve in a case where the pre-doping amount is 40%.

FIG. 1 shows a charge-discharge curve when the pre-doping amount (PD amount) of Li with respect to the charge capacity of the negative electrode is 0%, and FIG. 2 shows a charge-discharge curve when the pre-doping amount is 40%. The horizontal axis represents a state of charge (SOC), and the vertical axis represents a voltage value of an energy storage device cell. In FIGS. 1 and 2, curve a is the charge curve of the negative electrode, curve b is the discharge curve of the negative electrode, curve c is the charge curve of the positive electrode, curve d is the discharge curve of the positive electrode, curve e is the charge curve of the cell, and curve f is the discharge curve of the cell.

As shown in FIG. 1, when the pre-doping amount is 0%, the discharge capacity of the negative electrode is small as compared to that of the positive electrode, so that the discharge capacity of the cell is determined by the negative electrode. That is, the energy storage device is of a negative-electrode limiting type.

When the pre-doping amount in FIG. 2 is 40%, the discharge capacity of the positive electrode is small as compared to that of the negative electrode, so that the discharge capacity of the cell is determined by the positive electrode. That is, the energy storage device is of a positive-electrode limiting type. As described above, the positive-electrode limiting type energy storage device has improved cycle performance.

Figure 3:
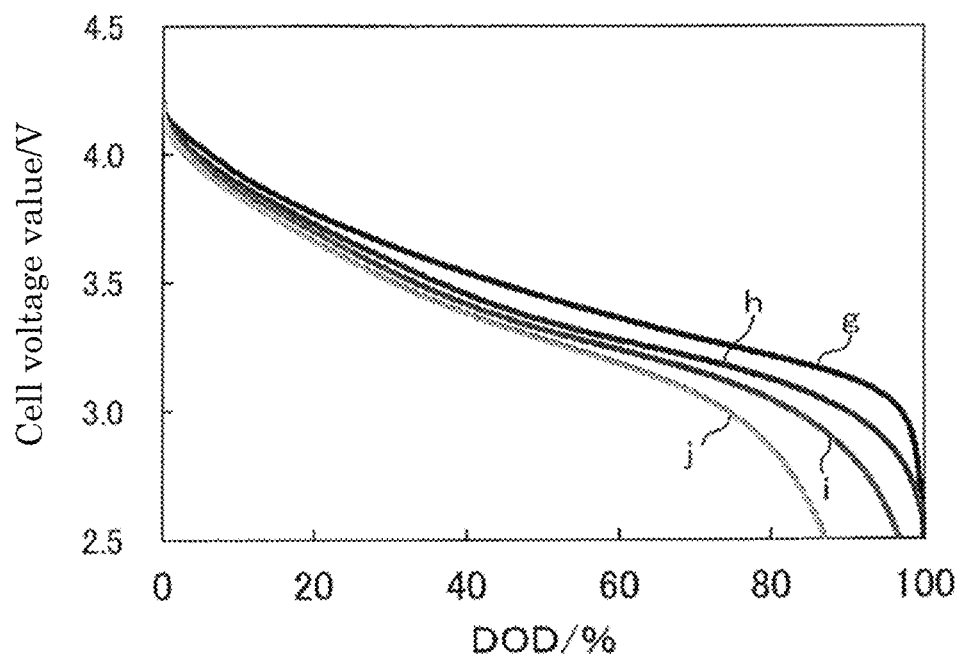
FIG. 3 is a graph showing the relationship between a depth of discharge (DOD) and a cell voltage value when charge and discharge are repeated.

FIG. 3 is a graph showing the relationship between a depth of discharge (DOD) and a cell voltage value when charge and discharge are repeated in an energy storage device that changes from the positive-electrode limiting type to the negative-electrode limiting type. The horizontal axis represents the DOD (%), and the vertical axis represents cell voltage value (V). In the figure, curve g is a graph before the start of the cycle, curve h is a graph after 300 cycles, curve i is a graph after 600 cycles, and curve j is a graph after 900 cycles.

As shown in FIG. 3, as the number of repetitions of the charge and discharge increases, deterioration progresses. In a predetermined voltage range, the shape of the discharge curve changes in an order of a first state (curve g), a second state with a gentler slope than the first state (curve h, curve i), and a third state (curve j) with a steeper slope than the second state. It is conceivable that the change from the second state to the third state is caused by a sharp rise of a negative electrode potential at the end of discharge due to a structural change or an increase in resistance of the silicon oxide of the negative electrode.

It is conceivable that as the number of repetitions of the charge and discharge increases, the amount of the SEI coating formed on the negative electrode increases, the Li ions are trapped in the film, the shift amount of the capacity balance increases, and the energy storage device reaches its end of life. By making the energy storage device a positive-electrode limiting type, the cycle performance is improved as compared to the negative-electrode limiting type energy storage device. However, when the number of cycles further increases, the energy storage device changes to the negative-electrode limiting type, and the capacity decreases gradually.

In one embodiment, a voltage value and an energization amount are acquired in a predetermined voltage range when the energy storage device is discharged or charged, or in a predetermined measured voltage value. DQ/dV may be determined based on the voltage value and the energization amount. When the charge and discharge are performed, dQ/dV at the time of charge or discharge is obtained.

In an energy storage device using $SiO_x$ for the negative electrode, in a predetermined voltage range in a curve showing the relationship between the voltage value and the capacity at the time of discharge or charge, the degree of change in voltage value changes due to an increase in the number of repetitions of the charge and discharge. The dQ/dV in this voltage range makes a specific change as the number of repetitions of the charge and discharge increases.

The predetermined voltage range is preferably a voltage range in which the potential of the negative electrode is equal to or higher than a first preset value, or a voltage range at the end of discharge of the energy storage device. In this voltage range, the voltage of the energy storage device rapidly decreases due to an increase in the number of repetitions of the charge and discharge. The absolute value of dQ/dV at a predetermined measured voltage value within this voltage range increases as the number of repetitions of the charge and discharge increases. When the number of repetitions of the charge and discharge further increases after an inflection point, the absolute value of dQ/dV decreases.

The range is preferably such that the negative electrode potential of the cell is equal to or higher than the first preset value. The first preset value may be, for example, 0.6 V (vs. Li/Li$^+$).

When the negative electrode potential cannot be acquired, the range is preferably a cell voltage range in which the potential of the negative electrode is equal to or lower than the second preset value. The second preset value may be, for example, 3.4 V. The cell voltage range is preferably from 2.5 V to 3.25 V, and more preferably from 2.75 V to 3.2 V.

When the absolute value of dQ/dV becomes equal to or greater than a first determination value, the limiting electrode of the energy storage device may have been switched from the positive electrode to the negative electrode.

Thereafter, when the absolute value of dQ/dV becomes equal to or smaller than a second determination value, it may be determined that the energy storage device has reached the end of its life.

In another embodiment, the internal state of the energy storage device is estimated based on information on the shape of the discharge curve of the energy storage device in the voltage range in which the potential of the negative electrode is equal to or greater than a first preset value, or information on the shape of the discharge curve of the energy storage device in the voltage range in which the potential of the negative electrode is smaller than a second preset value.

Here, "information on the shape of the discharge curve" includes, on the discharge curve drawn from the change in the amount of electricity and the change in voltage: (1) the shape; (2) a slope of a straight line between two predetermined points on the curve; and (3) an intersection angle of a tangent on the curve.

First Embodiment

Hereinafter, a first embodiment will be described by taking an energy storage apparatus mounted on a vehicle as an example.

Figure 4:
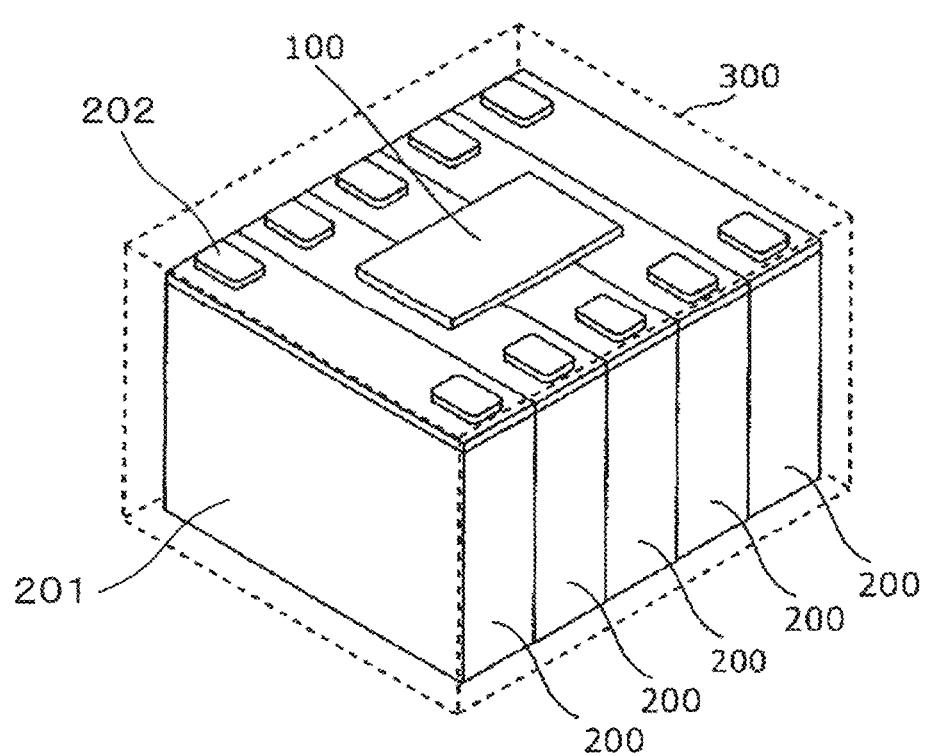
FIG. 4 is an external view of an energy storage apparatus including an estimation apparatus according to a first embodiment.

FIG. 4 is an external view of an energy storage apparatus 10 including an estimation apparatus 100 according to the first embodiment.

The energy storage apparatus 10 includes the estimation apparatus 100, a plurality of energy storage devices 200, and a housing case 300 that houses the estimation apparatus 100 and the energy storage devices 200.

The estimation apparatus 100 may include a circuit board on which a circuit for estimating the internal state of the energy storage device 200 is mounted, and may be disposed above the plurality of energy storage devices 200. The estimation apparatus 100 is connected to the plurality of energy storage devices 200, and acquires information from the plurality of energy storage devices 200 to estimate the internal state of the energy storage device 200. The estimation apparatus 100 may be achieved by a cell monitoring unit (CMU) or a battery management unit (BMU).

Alternatively, the estimation apparatus 100 may be disposed outside the housing case 300, or may be disposed at a remote location remote from the energy storage apparatus 10 and connected to the energy storage apparatus 10 via a network. The detailed functional configuration of the estimation apparatus 100 will be described later.

The energy storage device 200 is a secondary battery that can charge and discharge electricity. In the present embodiment, a nonaqueous electrolyte secondary battery such as a lithium ion secondary battery is used. A plurality of rectangular energy storage devices 200 are connected and arranged in series to form an assembled battery. The shape of the energy storage device 200 is not limited to a prismatic type but may be a cylindrical type, an elliptic cylindrical type, or a pouch type.

The energy storage device 200 includes a container 201 and electrode terminals 202 (a positive electrode terminal and a negative electrode terminal) protruding from the container 201. Inside the container 201, an electrode assembly and current collectors (a positive electrode current collector and a negative electrode current collector) for connecting the electrode assembly and the electrode terminal 202 are disposed, and an electrolyte solution (a nonaqueous electrolyte) has been sealed therein. The electrode assembly is formed by winding a positive electrode, a negative electrode, and a separator. The electrode assembly is not limited to a wound electrode assembly but may be a stacked electrode assembly in which flat electrode plates are stacked.

The positive electrode is an electrode plate in which a positive active material layer is formed on a positive electrode substrate which is a long strip-shaped metal foil made of, for example, aluminum, an aluminum alloy, or the like. As the positive active material used for the positive active material layer, a known material can be appropriately used so long as being a positive active material capable of occluding and releasing lithium ions. For example, examples of the positive active material include a transition metal oxide, a transition metal sulfide, a lithium transition metal composite oxide, and a lithium-containing polyanion metal composite compound. Examples of the transition metal oxide include manganese oxide, iron oxide, copper oxide, nickel oxide, and vanadium oxide. Examples of the transition metal sulfide include molybdenum sulfide and titanium sulfide. Examples of the lithium transition metal composite oxide include lithium-manganese composite oxide, lithium-nickel composite oxide, lithium-cobalt composite oxide, lithium-nickel-cobalt composite oxide, lithium-nickel-manganese composite oxide, and lithium-nickel-cobalt manganese composite oxide. Examples of the lithium-containing polyanion metal composite compound include lithium iron phosphate and lithium-cobalt phosphate. The example may further include conductive polymer compounds such as disulfide, polypyrrole, polyaniline, polyparastyrene, polyacetylene, and polyacene-based materials, and carbonaceous materials having a pseudo-graphite structure.

The active material of the lithium transition metal composite oxide type may be an Li excessive type active material in which a molar ratio (Mn/Me) of Mn in Me (transition metal) exceeds 0.5, and a composition ratio (Li/Me) of Li to a ratio of Me is greater than 1.

The positive active material may draw a stepped discharge curve in the graph of FIG. 3. However, since the present embodiment utilizes a change in the potential behavior of the negative electrode after many cycles, it is preferable to select a positive active material with which the potential of the positive electrode does not change in a very complicated manner.

From this viewpoint, a positive active material with which a discharge curve continuously changes or a flat portion is observed in a wide range is preferred. Examples of such a positive active material include a lithium transition metal composite oxide having a layered structure, and lithium iron phosphate having an olivine type crystal structure.

Alternatively, even when a positive electrode, the capacity of which decreases or the discharge curve of which changes in shape, is used, the deterioration state of the positive electrode is estimated, or the change in the curve shape due to a shift in the balance is estimated, so that it is possible to favorably estimate the internal state of the energy storage device.

The negative electrode is an electrode plate in which a negative active material layer is formed on a negative electrode substrate that is a long strip-shaped metal foil made of, for example, copper or a copper alloy. As the negative active material used in the negative active material layer, only $SiO_x$ may be used, or a mixture of $SiO_x$ and another negative active material capable of occluding and releasing lithium ions may be used. Other negative active materials used by mixing with $SiO_x$ include graphite, hard carbon, soft carbon, and the like. Among these other active materials, graphite is preferred because graphite has a relatively low charge-discharge potential and can thus provide an energy storage device with high energy density. Examples of graphite used by mixing with $SiO_x$ include flaky graphite, spherical graphite, artificial graphite, and natural graphite. Above all, it is preferable to use flaky graphite because, even when the charge and discharge are repeated, the contact with the surface of the $SiO_x$ particles can be easily maintained, and an energy storage device having excellent charge-discharge cycle performance can be provided with ease. The mixing ratio of $SiO_x$ and other negative active materials is not limited. For example, as the negative active material, a material in which $SiO_x$ and flaky graphite are blended at a ratio of 8:2 to 2:8 can be cited. Further, the negative active material may contain a conductive aid such as acetylene black and Ketjen black. The content ratio of $SiO_x$ in the negative active material is not particularly limited, but is preferably 5% by weight or more, and more preferably 10% by weight or more, in order to exhibit characteristics at the time of discharge described below. As the $SiO_x$ particles, particles having a surface coated with a carbon material in advance may be used.

$SiO_x$ is doped with Li. The timing for doping $SiO_x$ with Li may be any stage before the first charge is performed between the positive and negative electrodes. The negative composite may be formed by mixing Li-doped $SiO_x$ particles with another negative active material, a binder, or the like.

In the positive-electrode limiting type energy storage device 200, the greater the pre-doping amount of Li, the lower the utilization factor of the negative electrode, so that the cycle performance is improved, but the discharge capacity of the energy storage device decreases. Therefore, the pre-doping amount is set to an appropriate value based on the coulombic efficiency of the positive electrode, the content of $SiO_x$ in the negative electrode, the coulombic efficiency of the negative electrode, the cycle performance required for the energy storage device, a rated capacity, and the like.

The separator is a microporous sheet made of synthetic resin or the like. As the separator, a known material can be appropriately used so long as the performance of the energy storage device 200 is not impaired. The type of electrolyte solution (nonaqueous electrolyte) enclosed in the container 201 is not particularly limited so long as the performance of the energy storage device 200 is not impaired, and various types can be selected.

The energy storage device 200 is not limited to a nonaqueous electrolyte secondary battery but may be a secondary battery other than the nonaqueous electrolyte secondary battery.

Next, a functional configuration of the estimation apparatus 100 will be described.

Figure 5:
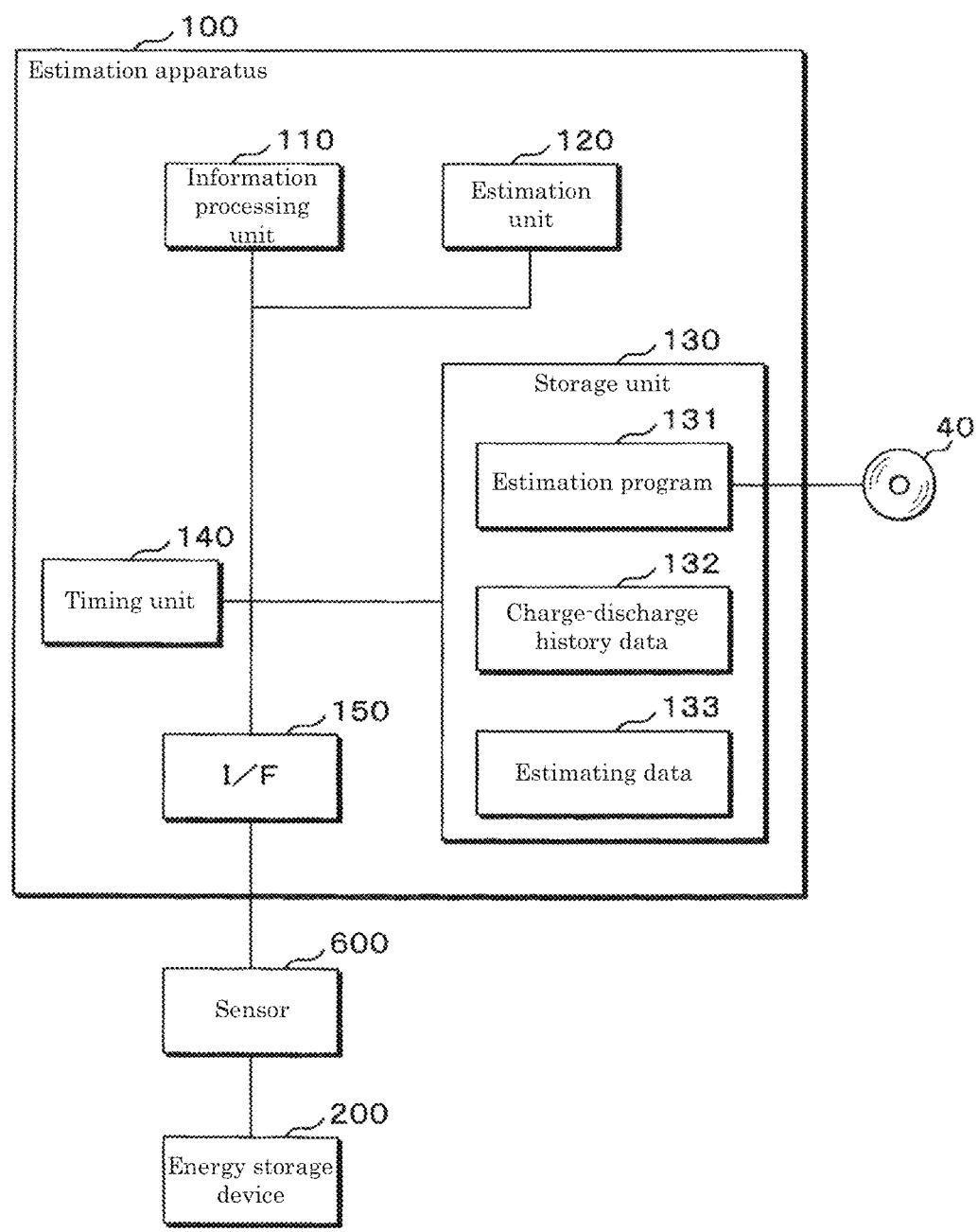
FIG. 5 is a block diagram showing a functional configuration of the estimation apparatus according to the first embodiment.

FIG. 5 is a block diagram showing a functional configuration of the estimation apparatus 100 according to the present embodiment.

The estimation apparatus 100 estimates the internal state of the energy storage device 200. The estimation apparatus 100 includes an information processing unit 110, an estimation unit 120, a storage unit 130, a timing unit 140, and an interface (I/F) 150. The storage unit 130 stores an estimation program 131 for estimating the internal state of the energy storage device 200, charge-discharge history data 132, and estimating data 133.

A sensor 600, such as a current sensor, a voltage sensor, and a temperature sensor, for detecting a physical quantity, such as a current value, a voltage value, and a temperature of each energy storage device 200, is connected to the information processing unit 110 via the I/F 150. Here, the plurality of sensors are represented as one "sensor 600." In some cases, the temperature is not detected by the sensor.

The estimation program 131 may be stored in the storage medium 40 in a computer-readable state. In this case, the storage unit 130 stores the estimation program 131 read from the storage medium 40 by a reader (not shown). The storage medium 40 may be a semiconductor memory such as a flash memory. Alternatively, the storage medium 40 may be an optical disc such as a compact disc (CD)-ROM, a digital versatile disc (DVD)-ROM, and a blu-ray (registered trademark) disc (BD). The storage medium 40 may be a magnetic disc such as a flexible disc or a hard disc, a magnetic optical disc, or the like. The estimation program 131 according to the present embodiment may be acquired from an external computer (not shown) connected to the communication network, and may be stored into the storage unit 130.

The information processing unit 110 acquires, from the sensor 600, detection information on the physical quantity of each energy storage device 200. The timing for acquiring the detection information is not particularly limited. The information processing unit 110 refers to the timing unit 140 to measure the timing. The information processing unit 110 writes the acquired detection information into the charge-discharge history data 132 of the storage unit 130. By the accumulation of the detection information on the physical quantity of the energy storage device 200, the temporal data of the physical quantity is obtained, and this becomes a charge-discharge history.

The charge-discharge history is an operation history of the energy storage device 200 and includes information indicating a period (use period) in which the energy storage device 200 was charged or discharged, information on charge or discharge performed by the energy storage device 200 in the use period, and the like. The information indicating the use period of the energy storage device 200 includes information indicating the point in time when the energy storage device 200 was charged or discharged, the cumulative use period in which the energy storage device 200 was used, and the like.

The information on the charge or discharge performed by the energy storage device 200 indicates the voltage, current, battery state, and the like at the time of charge or discharge performed by the energy storage device 200. The battery state indicates what operating state the energy storage device 200 is in, such as a charged state, a discharged state, a resting state, and the like. When the battery state is estimated from the information indicating the voltage or current of the energy storage device 200, the information indicating the battery state is unnecessary.

The information processing unit 110 reads, from the charge-discharge history data 132, a voltage, a current, an energization period, and the like in a case where the energy storage device 200 is discharged, and calculates an energization amount (Q). The information processing unit 110 calculates a change (dQ/dV) in the energization amount (Q) with respect to the voltage (V) at a predetermined measured voltage value in the predetermined voltage range.

The information processing unit 110 may calculate the capacity retention ratio of the energy storage device 200 from the calculated capacity.

The information processing unit 110 writes the acquired dQ/dV, a voltage value corresponding thereto, and the use period (e.g., date and time) into the estimating data 133 stored in the storage unit 130. The estimating data 133 may be a data table in which "use period," "voltage value," and "dQ/dV" are associated with one another.

The estimation unit 120 estimates the internal state of the energy storage device 200 by using dQ/dV acquired by information processing unit 110. Specifically, when the absolute value of dQ/dV becomes equal to or greater than a first determination value, the estimation unit 120 determines that the limiting electrode of the energy storage device has been switched from the positive electrode to the negative electrode.

Thereafter, when the absolute value of dQ/dV after the local maximum value (inflection point) becomes equal to or smaller than a second determination value, the estimation unit 120 determines that the energy storage device has reached the end of its life.

Figure 6:
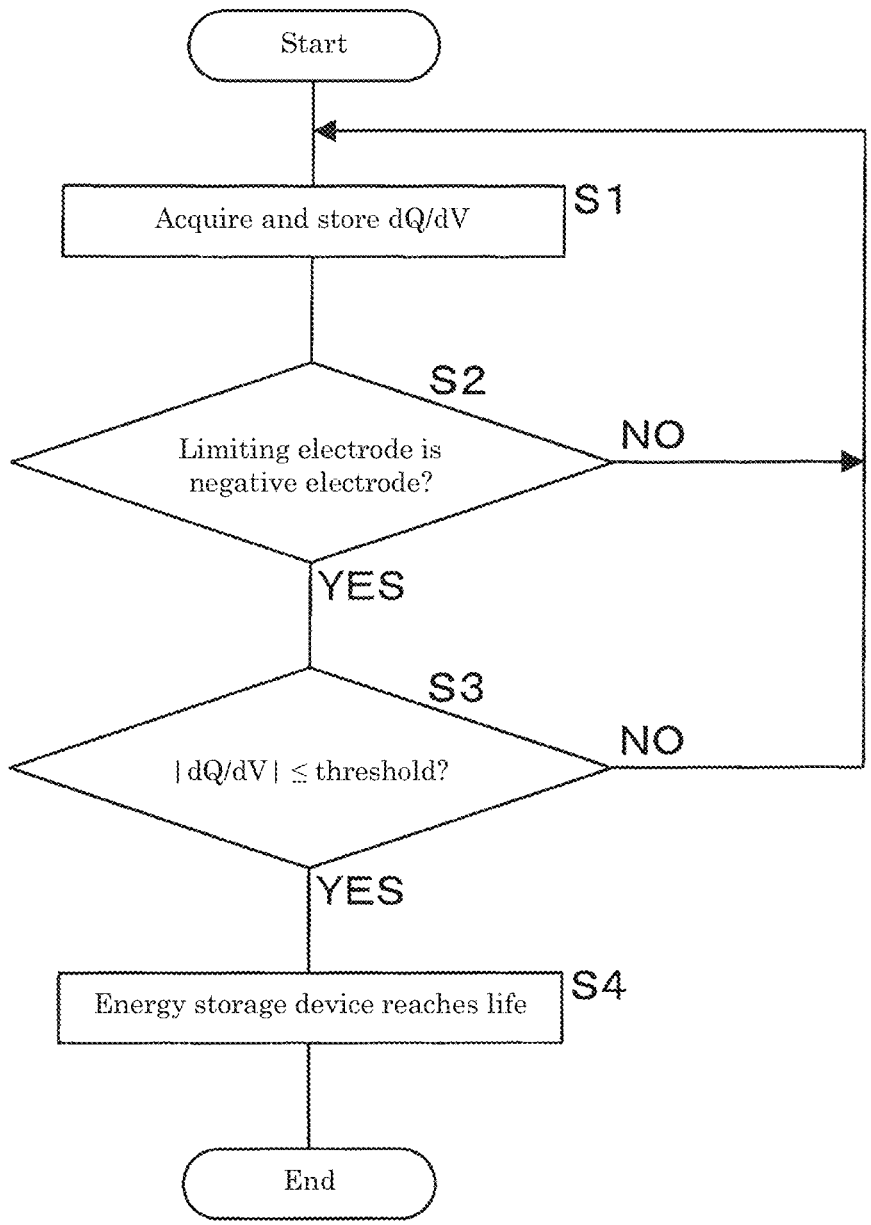
FIG. 6 is a flowchart showing a procedure of estimation processing for the internal state of the energy storage device, performed by the estimation apparatus.

FIG. 6 is a flowchart showing a procedure of estimation processing for the internal state of the energy storage device 200, performed by the information processing unit 110 and the estimation unit 120 of the estimation apparatus 100.

The information processing unit 110 of the estimation apparatus 100 acquires dQ/dV as described above when the energy storage device 200 is discharged at predetermined time intervals, and the information processing unit 110 stores the absolute value of the dQ/dV into the charge-discharge history data 132 of the storage unit 130 (S1).

The estimation unit 120 of the estimation apparatus 100 determines whether or not the limiting electrode of the energy storage device 200 is the negative electrode (S2). When the absolute value of dQ/dV becomes equal to or greater than the first determination value, it is determined that the limiting electrode of the energy storage device has been switched from the positive electrode to the negative electrode. When the estimation unit 120 determines that the limiting electrode is not the negative electrode (S2: NO), the processing returns to S1.

When determining that the limiting electrode of the energy storage device 200 is the negative electrode (S2: YES), the estimation unit 120 determines whether or not the absolute value of dQ/dV has become equal to or smaller than a threshold (second determination value) (S3). When the estimation unit 120 determines that the absolute value of dQ/dV is not equal to or smaller than the threshold (S3: NO), the processing returns to S1.

When determining that the absolute value of dQ/dV is equal to or smaller than the threshold (S3: YES), the estimation unit 120 determines that the energy storage device has reached the end of its life (S4) and causes, for example, a notifier to notify the determination to be notified to the storage unit to end the processing.

The estimation processing for the internal state performed by the estimation unit 120 will be described based on an example.

The active material represented by a composition formula $LiCo_{1/3}Ni_{1/3}Mn_{1/3}O_2$, acetylene black as a conductive aid, and polyvinylidene fluoride as a binder were contained at a mass ratio of 94:3:3 to prepare a positive electrode. $SiO_x$ and graphite as active materials and polyimide as the binder were contained at a mass ratio of 72:18:10 to prepare a negative electrode. Here, the pre-doping amounts are electrochemically changed to 0%, 20%, 30%, and 40% with respect to the charge capacity of the negative electrode, to prepare cells. The discharge capacity of the cell is 3 mAh/cm$^2$.

The greater the pre-doping amount, the greater the discharge capacity ratio of the negative electrode to the positive electrode. When the pre-doping amounts are 0% and 20%, the cell is of the negative-electrode limiting type (Comparative Example), and when the pre-doping amounts are 30% and 40%, the cell is of the positive-electrode limiting type (Example).

The relationship between the number of cycles and the capacity retention ratio (discharge capacity retention ratio) when the charge and discharge were repeated was determined for each cell.

Figure 7:
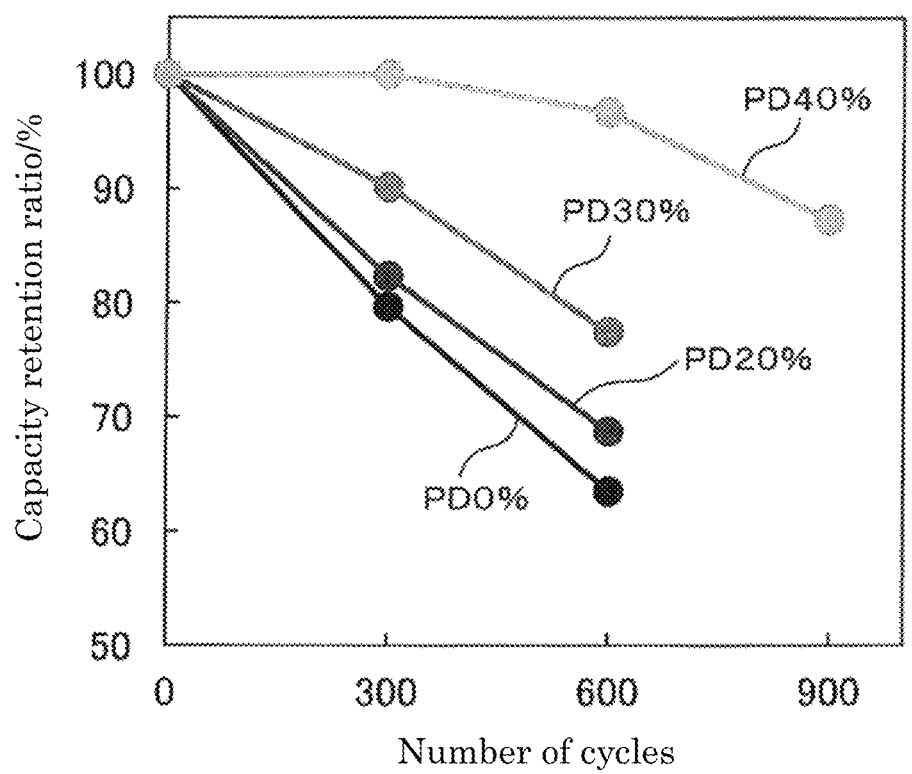
FIG. 7 is a graph showing the relationship between the number of cycles and a capacity retention ratio when the pre-doping amount is changed.

FIG. 7 is a graph showing the relationship between the number of cycles of each cell and the capacity retention ratio at a voltage value of 2.75V. The horizontal axis represents the number of cycles, and the vertical axis represents the capacity retention ratio (%).

FIG. 7 shows that with the increase in pre-doping amount, even when the number of cycles increases, the capacity decrease is reduced, and the cycle performance improves. It is conceivable that this is because the increase in the discharge capacity ratio causes a decrease in the utilization factor of the negative electrode, and reduces an increase in the shift amount of the capacity balance between the positive and negative electrodes due to the repeated charge and discharge.

For each cell, dQ/dV at a voltage value of 2.75 V when a charge-discharge cycle was performed was plotted with respect to the capacity retention ratio.

Figure 8:
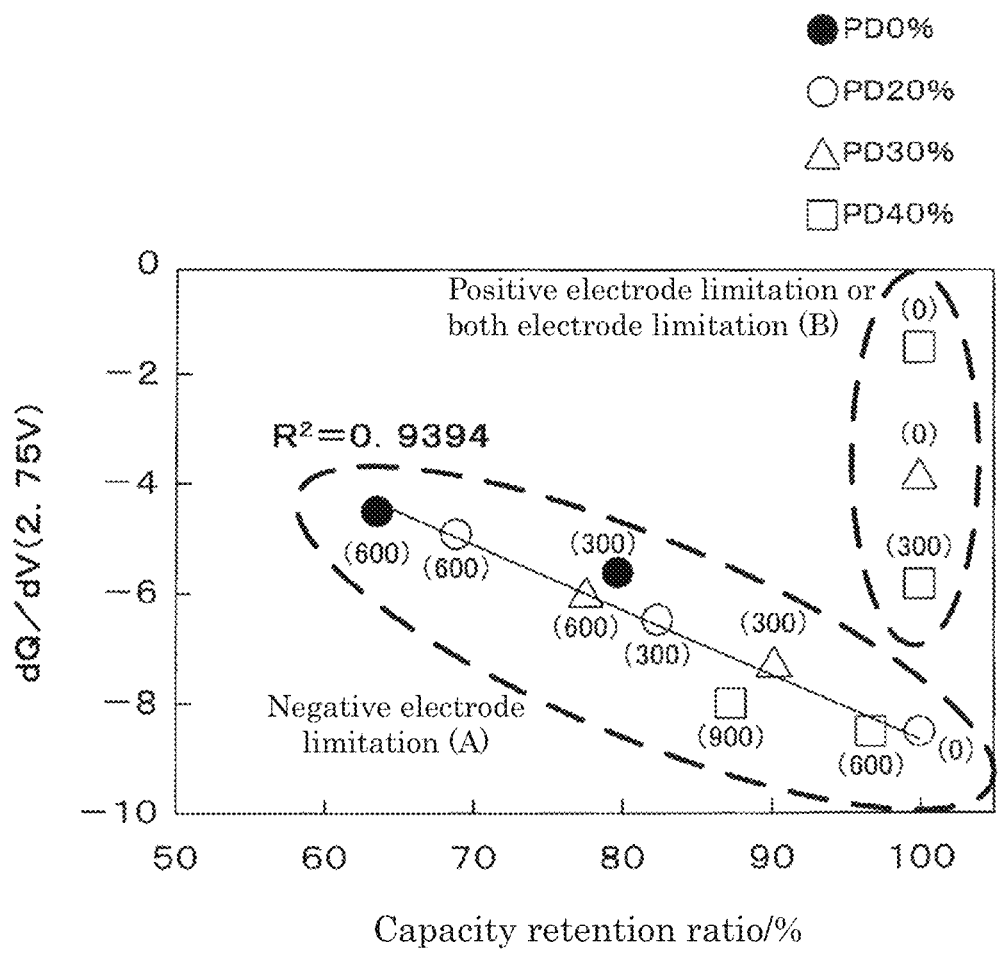
FIG. 8 is a graph showing the relationship between the capacity retention ratio and dQ/dV when the energy storage device is discharged and dQ/dV at a voltage value of 2.75 V is obtained.

FIG. 8 is a graph showing the relationship between the capacity retention ratio and dQ/dV. The horizontal axis represents the capacity retention ratio (%), and the vertical axis represents dQ/dV.

The numerical value in parentheses at each point corresponds to the number of cycles in FIG. 7.

In the case of the negative-electrode limiting type energy storage device in which the pre-doping amounts are 0% and 20%, the capacity retention ratio and the absolute value of dQ/dV are in a proportional relationship in a region (A) of FIG. 8.

When the positive-electrode limiting type energy storage device in which the pre-doping amount is 30% and 40%, after passage through a region (B) where the absolute value of dQ/dV increases without a decrease in discharge capacity, the absolute value of dQ/dV decreases in accordance with deterioration behavior in the region (A).

From the above, in the energy storage device that is the positive-electrode limiting type immediately after manufacturing and changes to the negative-electrode limiting type in accordance with the repetition of the charge and discharge, the internal state can be estimated regardless of the pre-doping amount, the balance between the positive and negative electrodes, and the history up to the area (A).

A further increase in the number of repetitions of the charge and discharge causes a shift in the capacity balance. In a case where the capacity of the positive electrode does not decrease and the discharge curve does not change even after the repeated charge and discharge, the apparent decrease in the capacity of the cell does not occur even when the shift of the capacity balance occurs. As the shift amount of the capacity balance between the positive and negative electrodes increases, the shape of the discharge curve changes. This corresponds to the region (B).

Further, as the shift amount of the capacity balance increases, the capacity of the cell starts to decrease. This corresponds to the area (A).

By monitoring the change in dQ/dV in the region (B), even when the capacity of the positive electrode does not decrease, the shift in the capacity balance between the positive and negative electrodes, that is, the internal state of the energy storage device 200, can be estimated.

Figure 9:
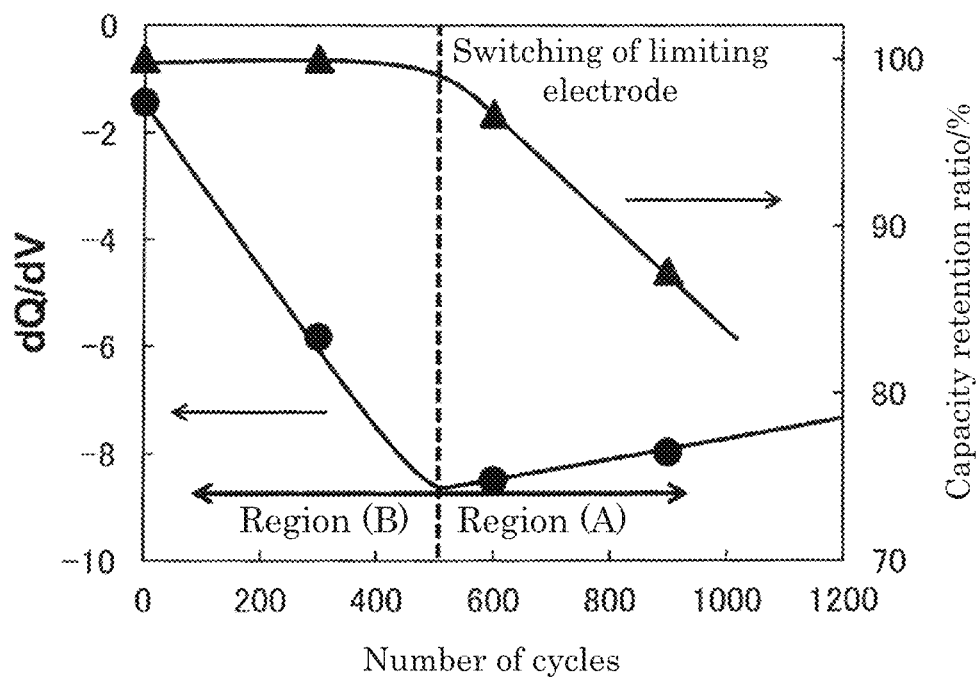
FIG. 9 is a graph showing the relationship between dQ/dV and the number of cycles at a voltage value of 2.75 V when an energy storage device having a pre-doping amount of 40% is used and discharged.

FIG. 9 is a graph showing the relationship between dQ/dV and the number of cycles at a voltage value of 2.75 V when the energy storage device 200 having a pre-doping amount of 40% is used and discharged. The horizontal axis represents the number of cycles, the left vertical axis represents dQ/dV, and the right vertical axis represents the capacity retention ratio (%).

As shown in FIG. 9, as the number of cycles increases, the absolute value of dQ/dV increases, and when the number of cycles exceeds approximately 500, dQ/dV decreases. The inflection point of dQ/dV is a switching point from the area of (B) to the area of (A). At this switching point, the capacity retention ratio starts to drop significantly.

DQ/dV at this switching point may be set to the first determination value.

The first determination value is obtained, for example, by an experiment and stored into the estimating data 133. The second determination value may be set based on the state of use of the energy storage device 200 or the like.

According to the estimation apparatus 100 of the present embodiment, in the energy storage device 200 that changes from the positive-electrode limiting type to the negative-electrode limiting type, the deterioration state of the energy storage device 200 can be estimated based on the change in dQ/dV at a predetermined measured voltage value within a predetermined voltage range at the time when the energy storage device 200 is discharged. It can be determined whether or not the energy storage device has changed from the positive-electrode limiting type to the negative-electrode limiting type. When the energy storage device changes to the negative-electrode limiting type and the shift amount of the capacity balance between the positive and negative electrodes increases, the capacity of the energy storage device 200 starts to decrease. The remaining life of the energy storage device 200 can be estimated based on the change in dQ/dV.

Hence, the internal state of the energy storage device 200 can be estimated.

The timing for acquiring dQ/dV at the end of discharge of the energy storage device 200 may be, for example, the time of periodic inspection of the energy storage apparatus, or the time of refresh charge using a charger (when the device is charged after fully discharged).

Second Embodiment

In the second embodiment, an electronic control unit (ECU) functions as an estimation apparatus.

Figure 10:
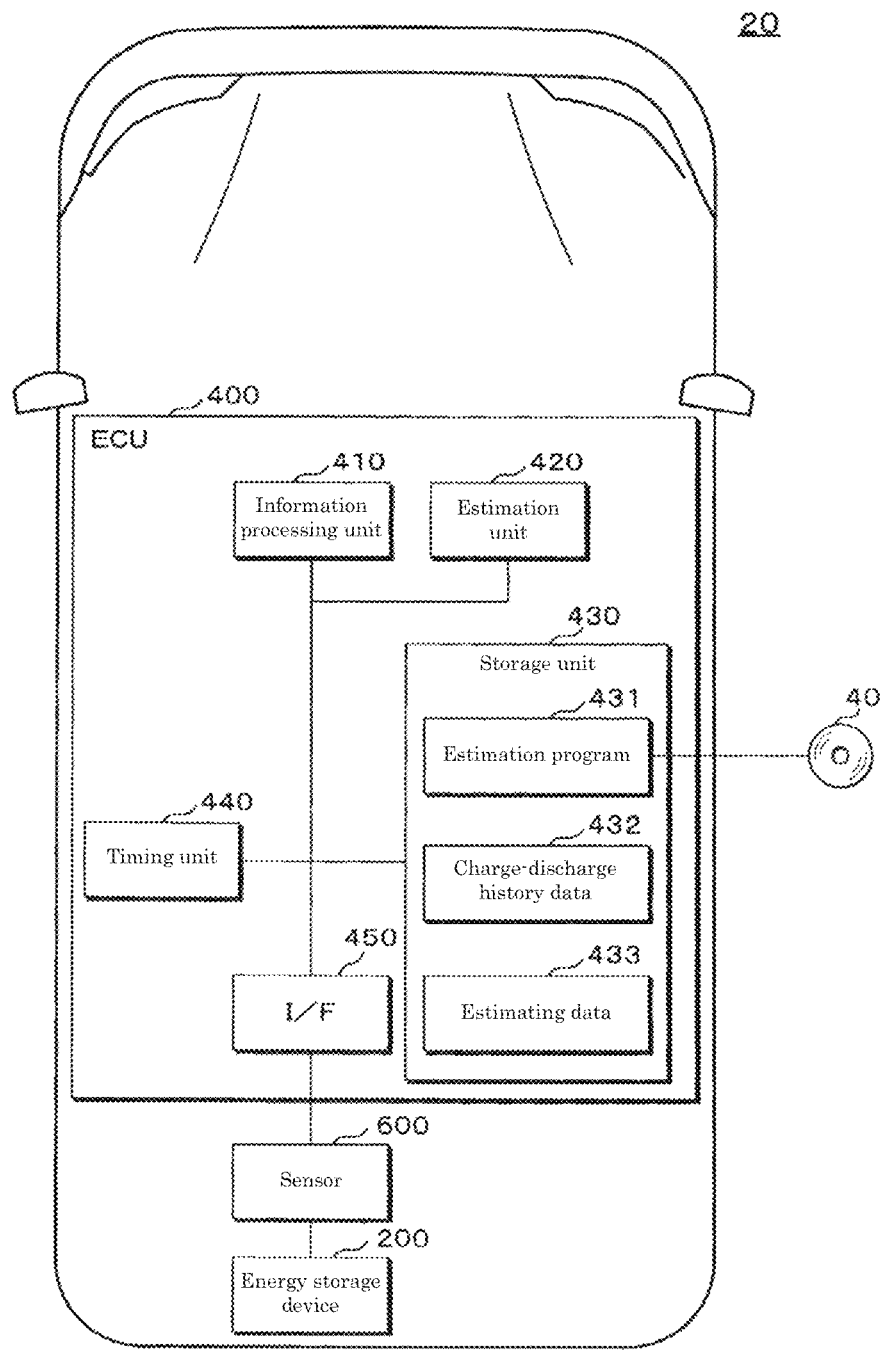
FIG. 10 is a block diagram showing a vehicle according to a second embodiment.

FIG. 10 is a block diagram showing a vehicle 20 according to the second embodiment.

The vehicle 20 includes an overall control ECU such as an engine ECU or an ECU 400 as an ECU for controlling the entire power supply.

The ECU 400 acquires signals indicating the states of the plurality of energy storage devices 200, determines the internal state of the energy storage devices 200, and controls the discharge state and charge state of the energy storage devices 200.

The ECU 400 includes an information processing unit 410, an estimation unit 420, a storage unit 430, a timing unit 440, and an I/F 450. A sensor 600, such as a current sensor, a voltage sensor, and a temperature sensor, for detecting a physical quantity, such as a current value, a voltage value, and a temperature of each energy storage device 200, is connected to the information processing unit 410 via the I/F 450. Here, the plurality of sensors are represented as one "sensor 600." In some cases, the temperature is not detected by the sensor.

The storage unit 430 stores an estimation program 431 for estimating the internal state of the energy storage device 200, charge-discharge history data 432, and estimating data 433. The estimation program 431 may be stored in the storage medium 40 in a computer-readable state. In this case, the storage unit 430 stores the estimation program 431 read from the storage medium 40 by a reader (not shown). The estimation program 431 may be acquired from an external computer (not shown) connected to the communication network, and may be stored into the storage unit 430.

The information processing unit 410 acquires, from the sensor 600, detection information on the physical quantity of each energy storage device 200. The information processing unit 410 refers to the timing unit 440 to measure the timing. The information processing unit 410 writes the acquired detection information into the charge-discharge history data 432 of the storage unit 430. By the accumulation of the detection information on the physical quantity of the energy storage device 200, the temporal data of the physical quantity is obtained, and this becomes a charge-discharge history.

The information processing unit 410 reads, from the charge-discharge history data 432, a voltage, a current, an energization period, and the like in a case where the energy storage device 200 is discharged, and calculates an energization amount (Q). DQ/dV at a predetermined measured voltage value in a predetermined voltage range is calculated. The predetermined voltage range is preferably from 2.4V to 3.25V. The information processing unit 410 may calculate the capacity retention ratio corresponding to dQ/dV from the calculated capacity.

The information processing unit 410 writes the acquired dQ/dV, a voltage corresponding thereto, and the use period (e.g., date and time) into the estimating data 433 stored in the storage unit 430. The estimating data 433 is a data table in which "use period," "voltage," and "dQ/dV" are associated with one another.

The estimation unit 420 estimates the internal state of the energy storage device 200 by using dQ/dV acquired by information processing unit 410. Specifically, when the absolute value of dQ/dV becomes equal to or greater than a first determination value, the estimation unit 420 determines that the limiting electrode of the energy storage device has been switched from the positive electrode to the negative electrode.

Thereafter, when the absolute value of dQ/dV becomes equal to or smaller than a second determination value, the estimation unit 420 determines that the energy storage device has reached the end of its life.

According to the ECU 400 of the present embodiment, in the energy storage device 200 that changes from the positive-electrode limiting type to the negative-electrode limiting type, the deterioration state of the energy storage device 200 can be estimated based on the change in dQ/dV at a predetermined measured voltage value within a predetermined voltage range at the time when the energy storage device 200 is discharged. It can be determined whether or not the energy storage device has changed from the positive-electrode limiting type to the negative-electrode limiting type. When the energy storage device changes to the negative-electrode limiting type and the shift of the capacity balance between the positive and negative electrodes increases, the capacity of the energy storage device 200 starts to decrease. The remaining life of the energy storage device 200 can be estimated based on the change in dQ/dV.

Hence, the internal state of the energy storage device 200 can be estimated.

Third Embodiment

In the third embodiment, an internal state estimation server 500 functions as the estimation apparatus.

Figure 11:
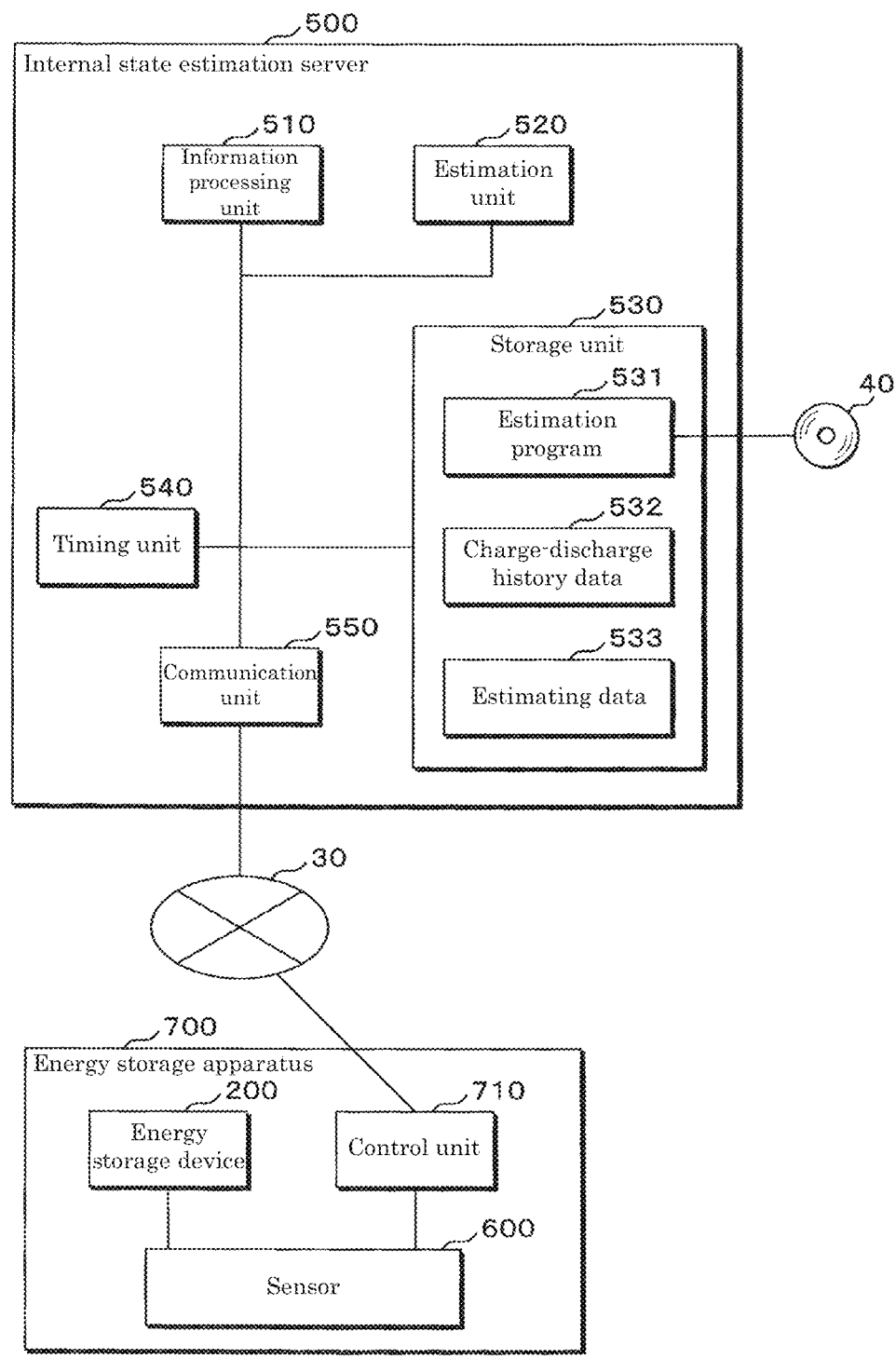
FIG. 11 is a block diagram showing an internal state estimation server and an energy storage device according to a third embodiment.

FIG. 11 is a block diagram showing the internal state estimation server 500 and an energy storage apparatus 700 according to the third embodiment.

The internal state estimation server 500 includes an information processing unit 510, an estimation unit 520, a storage unit 530, a timing unit 540, and a communication unit 550.

The energy storage apparatus 700 includes a plurality of energy storage devices 200, a sensor 600, such as a current sensor, a voltage sensor, and a temperature sensor, for detecting a physical quantity, such as a current value, a voltage value, and a temperature of each energy storage device 200, and a control unit 710.

FIG. 11 represents a plurality of sensors as one "sensor 600," and shows only one energy storage device 200.

The information processing unit 510 is connected to the control unit 710 of the energy storage apparatus 700 via the communication unit 550 and a network 30. The information processing unit 510 transmits and receives data to and from the control unit 710 via the network 30.

The storage unit 530 stores an estimation program 531 for estimating the internal state of the energy storage device 200, charge-discharge history data 532, and estimating data 533. The estimation program 531 may be stored in the storage medium 40 in a computer-readable state. In this case, the storage unit 530 stores the estimation program 531 read from the storage medium 40 by a reader (not shown). The estimation program 531 according to the present embodiment may be acquired from an external computer (not shown) connected to the communication network, and may be stored into the storage unit 530.

The information processing unit 510 acquires, from the sensor 600, detection information on the physical quantity of the energy storage device 200. The information processing unit 510 refers to the timing unit 540 to measure the timing. The information processing unit 510 writes the acquired detection information into the charge-discharge history data 532 of the storage unit 530. By the accumulation of the detection information on the physical quantity of the energy storage device 200, the temporal data of the physical quantity is obtained, and this becomes a charge-discharge history.

The information processing unit 510 reads, from the charge-discharge history data 532, a voltage, a current, an energization period, and the like in a case where the energy storage device 200 is discharged, and calculates an energization amount (Q). DQ/dV at a predetermined measured voltage value in a predetermined voltage range is calculated. The predetermined voltage range is preferably from 2.4V to 3.25V. The information processing unit 510 may calculate the capacity retention ratio corresponding to dQ/dV from the calculated capacity.

The information processing unit 510 writes the acquired dQ/dV, a voltage corresponding thereto, and the use period (e.g., date and time) into the estimating data 533 stored in the storage unit 530. The estimating data 533 is a data table in which "use period," "voltage," and "dQ/dV" are associated with one another.

The estimation unit 520 estimates the internal state of the energy storage device 200 by using dQ/dV acquired by information processing unit 510. Specifically, when the absolute value of dQ/dV becomes equal to or greater than a first determination value, the estimation unit 520 determines that the limiting electrode of the energy storage device has been switched from the positive electrode to the negative electrode.

Thereafter, when the absolute value of dQ/dV becomes equal to or smaller than a second determination value, the estimation unit 520 determines that the energy storage device has reached the end of its life.

According to the internal state estimation server 500 of the present embodiment, in the energy storage device 200 that changes from the positive-electrode limiting type to the negative-electrode limiting type, the deterioration state of the energy storage device 200 can be estimated based on the change in dQ/dV at a predetermined measured voltage value within a predetermined voltage range at the time when the energy storage device 200 is discharged. It can be determined whether or not the energy storage device has changed from the positive-electrode limiting type to the negative-electrode limiting type. When the energy storage device changes to the negative-electrode limiting type and the shift of the capacity balance between the positive and negative electrodes increases, the capacity of the energy storage device 200 starts to decrease. The remaining life of the energy storage device 200 can be estimated based on the change in dQ/dV.

Hence the internal state of the energy storage device 200 can be estimated.

In summary, the estimation apparatus estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode. The estimation apparatus includes an acquisition unit that acquires a voltage value and an energization amount in a predetermined voltage range of the energy storage device or at a predetermined measured voltage value; and an estimation unit that estimates the internal state of the energy storage device by using the voltage value and the amount of current.

According to the above configuration, in the energy storage device that changes from the positive-electrode limiting type to the negative-electrode limiting type with the use (cycle), it is possible to estimate the deterioration state of the energy storage device based on a voltage value and an energization amount in a predetermined voltage range or at a predetermined measured voltage value at the time when the energy storage device is discharged. It can be determined whether or not the energy storage device has changed from the positive-electrode limiting type to the negative-electrode limiting type. When the energy storage device changes to the negative-electrode limiting type and the shift of the capacity balance between the positive and negative electrodes increases, the capacity of the energy storage device starts to decrease. The remaining life of the energy storage device can be estimated based on the voltage value and the energization amount (e.g., the change in dQ/dV).

Accordingly, it is possible to estimate the internal state of the energy storage device (whether the energy storage device is of the positive-electrode limiting type or the negative-electrode limiting type, how the energy storage device deteriorates in the near future, and how long is the remaining life of the energy storage device).

The estimation unit may determine whether or not dQ/dV obtained from the voltage value and the energization amount has reached the first determination value or an inflection point.

The first determination value is arbitrarily set so that it can be determined that the energy storage device has changed from the positive-electrode limiting type to the negative-electrode limiting type. According to the above configuration, it is possible to determine whether or not the energy storage device has changed from the positive-electrode limiting type to the negative-electrode limiting type, and it is thus possible to accurately estimate how the energy storage device will deteriorate in the near future.

The estimation unit may determine whether or not the dQ/dV has reached the second determination value.

The second determination value is arbitrarily set so that it can be determined that the energy storage device has reached the end of its life. According to the above configuration, it is possible to easily determine whether or not the energy storage device has reached the end of its life.

The predetermined voltage range may be a voltage range in which the potential of the negative electrode is equal to or higher than a first preset value, or may be a voltage range in which the potential of the negative electrode is equal to or lower than a second preset value.

In this range, the voltage sharply and characteristically decreases due to an increase in the number of repetitions of the charge and discharge. The absolute value of dQ/dV at a predetermined measured voltage value within this voltage range increases as the number of repetitions of the charge and discharge increases. When the number of repetitions further increases, the absolute value of dQ/dV decreases.

This facilitates the monitoring and estimation of the internal state of the energy storage device.

The energy storage apparatus includes a positive electrode, a negative electrode including a negative active material that contains silicon oxide ($SiO_x$), and a nonaqueous electrolyte, and includes a positive-electrode limiting type energy storage device, the discharge capacity of which is limited by the positive electrode, and the estimation apparatus described above.

According to the above configuration, the internal state of the energy storage device can be estimated by, for example, a CMU or a BMU built in or integrated with the energy storage apparatus.

The ECU estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode. The ECU includes an acquisition unit that acquires dQ/dV from a voltage value and an energization amount in a predetermined voltage range of the energy storage device or at a predetermined measured voltage value; and an estimation unit that estimates the internal state of the energy storage device by using the dQ/dV.

According to the above configuration, the internal state of the energy storage device can be estimated by the ECU mounted on the vehicle.

The server estimates an internal state of an electric device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode. The server includes an acquisition unit that acquires dQ/dV from a voltage value and an energization amount in a predetermined voltage range of the energy storage device or at a predetermined measured voltage value; and an estimation unit that estimates the internal state of the energy storage device by using the dQ/dV.

According to the above configuration, it is possible to remotely estimate the internal state of the energy storage device.

The estimation methods estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode. The estimation method acquires dQ/dV from a voltage value and an energization amount in a predetermined voltage range of the energy storage device or at a predetermined measured voltage value; and estimates the internal state of the energy storage device by using the dQ/dV.

According to the above configuration, it is possible to estimate the internal state of the energy storage device based on the change in dQ/dV in a predetermined voltage range of the energy storage device that changes from the positive-electrode limiting type to the negative-electrode limiting type or at a predetermined measured voltage value.

A computer program causes a computer which estimates an internal state of an energy storage device to execute the processing of dQ/dV from a voltage value and an energization amount in a predetermined voltage range of the energy storage device or at a predetermined measured voltage value; and estimating the internal state of the energy storage device using the dQ/dV, the energy storage device having a positive electrode, a negative electrode that includes a negative active material which contains silicon oxide ($SiO_x$), and a nonaqueous electrolyte, and changing from a positive-electrode limiting type, in which a discharge capacity is limited by the positive electrode, to a negative-electrode limiting type, in which the discharge capacity is limited by the negative electrode.

A computer-readable storage medium stores the computer program described above.

According to the above configuration, the internal state of the energy storage device can be estimated by any computer based on the change in dQ/dV in a predetermined voltage range of the energy storage device that changes from the positive-electrode limiting type to the electrode limiting type or at a predetermined measured voltage value.

The present invention is not limited to the contents of the embodiments described above, but various changes can be made within the scope shown in the claims. That is, embodiments obtained by combining technical means appropriately changed within the scope of the claims are also included in the technical scope of the present invention.

DESCRIPTION OF REFERENCE SIGNS

10: energy storage apparatus
20: vehicle
40: storage medium
100: estimation apparatus
110: information processing unit (acquisition unit)
120: estimation unit
130, 430, 530: storage unit
131, 431, 531: estimation program
200: energy storage device
201: case
202: electrode terminal
300: storage case
400: ECU
500: internal state estimation server

The invention claimed is:

1. An estimation apparatus that estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode, the estimation apparatus comprising:

an acquisition unit that acquires a voltage value and an energization amount in a predetermined voltage range of the energy storage device or at a predetermined measured voltage value; and an estimation unit that estimates the internal state of the energy storage device by using the voltage value and the energization amount to determine whether the energy storage device changes from the positive-electrode limiting type to the negative-electrode limiting type.

2. The estimation apparatus according to claim 1, wherein the estimation unit determines whether the energy storage device is of the positive-electrode limiting type or the negative-electrode limiting type by using the voltage value and the energization amount.

3. The estimation apparatus according to claim 1, wherein the estimation unit determines whether dQ/dV obtained from the voltage value and the energization amount reaches a first determination value or an inflection point.

4. The estimation apparatus according to claim 3, wherein the estimation unit determines whether the dQ/dV reaches a second determination value after reaching the first determination value or the inflection point.

5. The estimation apparatus according to claim 1, wherein the predetermined voltage range is a voltage range in which the potential of the negative electrode is equal to or greater than a first preset value, or a voltage range in which the potential of the negative electrode is equal to or lower than a second preset value.

6. An estimation method that estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode, the estimation method comprising:

acquiring a voltage value and an energization amount in a predetermined voltage range of the energy storage device or at a predetermined measured voltage value; and estimating the internal state of the energy storage device using the voltage value and the energization amount to determine whether the energy storage device changes from the positive-electrode limiting type to the negative-electrode limiting type.

7. A computer program that causes a computer to estimate an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode, the computer program causing the computer to execute the processing of:

acquiring a voltage value and an energization amount in a predetermined voltage range of the energy storage device or at a predetermined measured voltage value; and estimating the internal state of the energy storage device using the voltage value and the amount of current to determine whether the energy storage device changes from the positive-electrode limiting type to the negative-electrode limiting type.

8. An estimation apparatus that estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode, the estimation apparatus comprising an estimation unit that estimates the internal state of the energy storage device based on information on a shape of a discharge curve of the energy storage device in a voltage range in which a potential of the negative electrode is equal to or greater than a first preset value, or information on a shape of a discharge curve of the energy storage device in a voltage range in which a potential of the negative electrode is smaller than a second preset value, to determine whether the energy storage device changes from the positive-electrode limiting type to the negative-electrode limiting type.

9. The estimation apparatus according to claim 8, wherein the estimation unit determines whether the energy storage device is of the positive-electrode limiting type or the negative-electrode limiting type based on the information on the shape of the discharge curve.

10. The estimation apparatus according to claim 8, wherein the estimation unit estimates the internal state of the energy storage device based on a change in the shape of the discharge curve of the energy storage device in the voltage range.

11. The estimation apparatus according to claim 8, wherein the shape of the discharge curve changes in an order of a first state, a second state with a gentler slope than the first state, and a third state with a steeper slope than the second state.

12. An estimation method that estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode, the estimation method comprising estimating an internal state of the energy storage device based on information on a shape of a discharge curve of the energy storage device in a voltage range in which a potential of the negative electrode is equal to or greater than a first preset value, or information on a shape of a discharge curve of the energy storage device in a voltage range in which a potential of the negative electrode is smaller than a second preset value, to determine whether the energy storage device changes from the positive-electrode limiting type to the negative-electrode limiting type.

13. A computer program that causes a computer to execute an estimation apparatus that estimates an internal state of an energy storage device having a positive electrode, a negative electrode including a negative active material that contains silicon oxide ($SiO_x$), and a nonaqueous electrolyte, the energy storage device changing from a positive-electrode limiting type, in which a discharge capacity is limited by the positive electrode, to a negative-electrode limiting type, in which the discharge capacity is limited by the negative electrode, wherein the computer program causes the computer to execute processing of estimating an internal state of the energy storage device based on information on a shape of a discharge curve of the energy storage device in a voltage range in which a potential of the negative electrode is equal to or greater than a first preset value, or information on a shape of a discharge curve of the energy storage device in a voltage range in which a potential of the negative electrode is smaller than a second preset value, to determine whether the energy storage device changes from the positive-electrode limiting type to the negative-electrode limiting type.

* * * * *